United States Patent
Hackman

(10) Patent No.: US 7,223,915 B2
(45) Date of Patent: May 29, 2007

(54) CABLE ASSEMBLY WITH OPPOSED INVERSE WIRE MANAGEMENT CONFIGURATIONS

(75) Inventor: John A. Hackman, Elizabethtown, PA (US)

(73) Assignee: Tyco Electronics Corporation, Middletown, PA (US)

( * ) Notice: Subject to any disclaimer, the term of this patent is extended or adjusted under 35 U.S.C. 154(b) by 78 days.

(21) Appl. No.: 11/017,124

(22) Filed: Dec. 20, 2004

(65) Prior Publication Data

US 2006/0131056 A1    Jun. 22, 2006

(51) Int. Cl.
*H02G 15/02* (2006.01)
*H01R 9/03* (2006.01)

(52) U.S. Cl. ............... 174/36; 174/74 R; 174/77 C; 174/84 R; 174/88 C; 439/610

(58) Field of Classification Search .......... 174/74 R, 174/75 C, 77 R, 78, 79, 84 R, 84 S, 88 R, 174/88 C; 439/77, 493, 76.1, 497
See application file for complete search history.

(56) References Cited

U.S. PATENT DOCUMENTS

| | | | | |
|---|---|---|---|---|
| 4,954,101 A | * | 9/1990 | Nelson | 439/502 |
| 5,174,770 A | * | 12/1992 | Sasaki et al. | 439/108 |
| 5,176,538 A | * | 1/1993 | Hansell et al. | 439/607 |
| 5,195,899 A | * | 3/1993 | Yatsu et al. | 439/101 |
| 5,364,292 A | * | 11/1994 | Bethurum | 439/610 |
| 5,424,490 A | * | 6/1995 | Dombrowski et al. | 174/33 |
| 5,719,933 A | * | 2/1998 | Welch | 379/397 |
| 5,848,914 A | * | 12/1998 | Lang et al. | 439/610 |
| 5,934,942 A | * | 8/1999 | Patel et al. | 439/610 |
| 6,135,818 A | * | 10/2000 | Lang et al. | 439/610 |
| 6,194,652 B1 | * | 2/2001 | Ivan | 174/33 |
| 6,250,936 B1 | * | 6/2001 | Armistead et al. | 439/98 |
| 6,299,490 B1 | * | 10/2001 | Schultz et al. | 439/676 |
| 6,336,827 B1 | * | 1/2002 | Akama et al. | 439/610 |
| 6,764,342 B2 | * | 7/2004 | Murayama et al. | 439/608 |
| 6,893,270 B2 | * | 5/2005 | Sercu | 439/76.1 |
| 2001/0053624 A1 | * | 12/2001 | Medina et al. | 439/404 |
| 2006/0040554 A1 | * | 2/2006 | Liu | 439/607 |

\* cited by examiner

*Primary Examiner*—William H. Mayo, III

(57) ABSTRACT

A cable assembly is provided that includes a wire bundle having individual wires, and first and second connectors provided on first and second ends of said wire bundle. The first and second connectors include first and second circuit boards, respectively. The first and second ends of the wires are terminated on the first and second circuit boards in accordance with different first and second wire management configurations, respectively.

17 Claims, 5 Drawing Sheets

CABLE ASSEMBLY WITH OPPOSED INVERSE WIRE MANAGEMENT CONFIGURATIONS

BACKGROUND OF THE INVENTION

This invention relates generally to cable assemblies, and more particularly, to wire management configurations for cable assemblies.

Modern electronic devices use cable assemblies to link various electronic components. Conventional cable assemblies typically include a cable having a wire bundle that extend between electrical connectors. In some applications, the electrical connectors include circuit boards that carry and are electrically coupled to various electronic components. The individual wires in the wire bundle are electrically and mechanically coupled at signal contacts on the circuit boards in the respective electrical connectors. The wires may be coupled to the circuit boards as differential pairs. As connectors and the circuit boards therein are reduced in size, less and less room is available for the wires to enter the connectors. Hence, it has become increasingly of interest to arrange the wires in a space efficient manner where the wires enter the rear of the connector.

Conventional cable assemblies utilize identical circuit boards in each of the electrical connectors. Hence, the wires in each cable assembly extend between the electrical connectors and are coupled to the same type of circuit board at opposite electrical connectors. However, during assembly, the wires do not readily align with the signal contacts of the opposing circuit boards. Accordingly, the wires at one end of the cable assembly are rearranged until aligning with associated contacts on the opposing circuit board. Rearranging the wires increases the manufacturing time and complexity and increases the envelope of the wires, thereby increasing the overall cost and size of the cable assembly.

BRIEF DESCRIPTION OF THE INVENTION

In accordance with an embodiment of the present invention, a cable assembly is provided that includes a wire bundle having individual wires that may be arranged in differential pairs, and first and second connectors provided on first and second ends of the wire bundle. The first and second connectors include first and second circuit boards, respectively. The first and second ends of the wires are terminated on the first and second circuit boards in accordance with different first and second wire management configurations, respectively. Optionally, the first and second wire management configurations may be inverse configurations of one another. Optionally, the first and second circuit boards may have wire management ends attached to the first and second ends of the wires, respectively, and opposing ends forming separable interfaces.

One example of a wire management configuration may include differential pairs of the wires designated 1 to N, wherein the 1 to N differential pairs of wires may be joined to the first circuit board in a clockwise pattern about the first circuit board, and wherein the 1 to N differential pairs of wires may be joined to the second circuit board in a counter-clockwise pattern about the second circuit board.

Another example of a wire management configuration may include first and second circuit boards having contact layouts that include upper inner, upper outer, lower inner, and lower outer positions, wherein the wire bundle has a first differential pair of wires joined to the first circuit board at the upper inner position and to the second circuit board at the lower outer position.

Certain embodiments of the present invention may also include the first circuit board having a pair of signal contacts provided on a common side and at a wire management end of the first circuit board, wherein the pair of signal contacts may be interconnected along a pair of traces to a pair of internal signal contacts at a separable interface end of the circuit board, and wherein the pair of interface signal contacts may be located opposite one another on opposite sides of the circuit board. Optionally, the pair of traces may be located on opposite sides of the first circuit board.

Certain embodiments of the present invention may also include signal traces on the first circuit board arranged in differential pairs, wherein signal traces of a first differential pair are located on opposite sides of the first circuit board and arranged along a plane extending perpendicularly to the sides of the first circuit board.

DETAILED DESCRIPTION OF THE INVENTION

Figure 1:
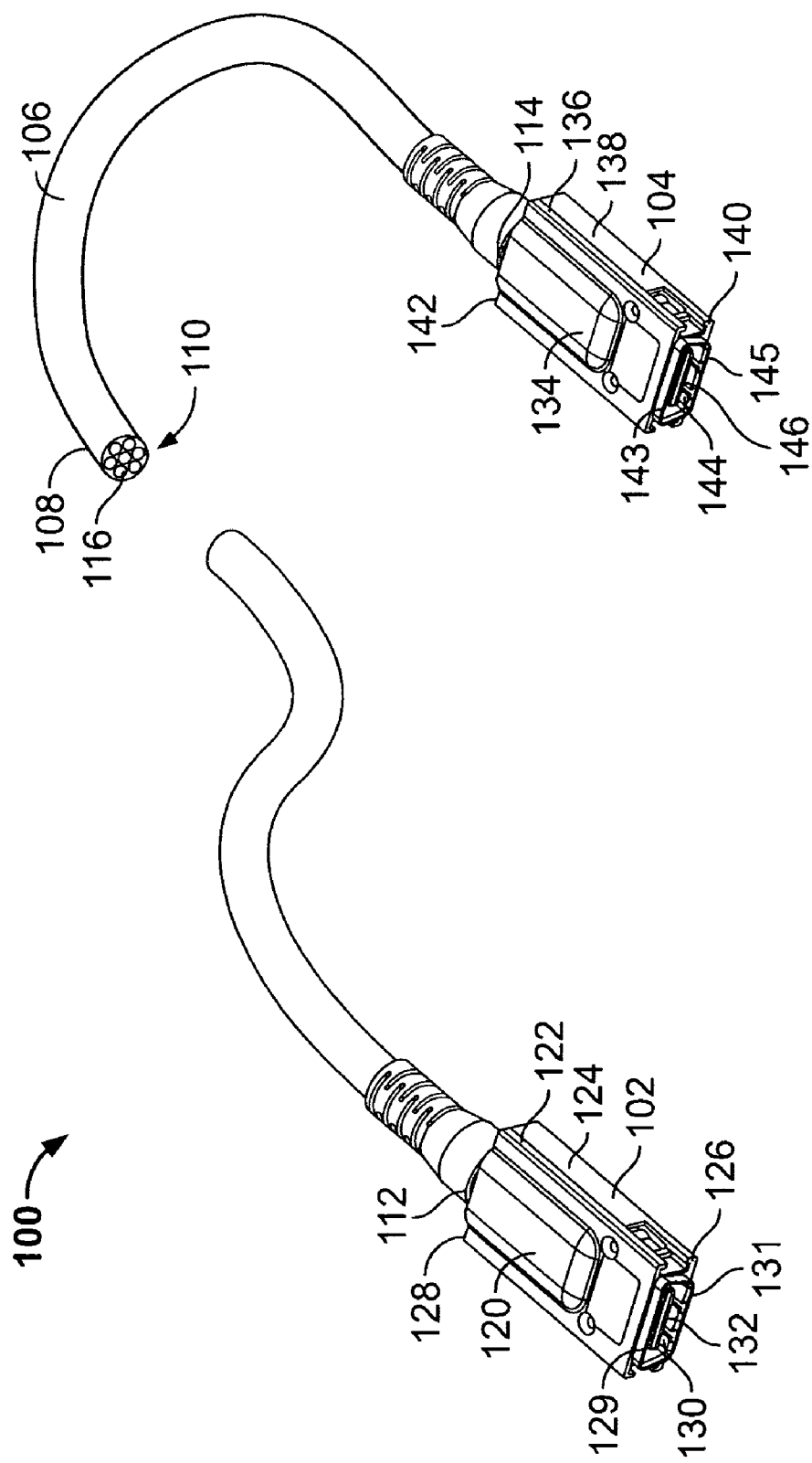
FIG. 1 illustrates a perspective view of a cable assembly formed in accordance with an embodiment of the present invention.

FIG. 1 illustrates a perspective view of a cable assembly 100 including a first electrical connector 102, a second electrical connector 104, and a cable 106 extending therebetween. The cable 106 includes an insulating cover 108 that circumscribes a wire bundle 110. The cable 106 has a first end 112 and a second end 114. The first end 112 is coupled to the first electrical connector 102, and the second end 114 is coupled to the second electrical connector 104. The wire bundle 110 includes a plurality of individually shielded wires 116 that may be arranged in differential pairs. Alternatively, the wire bundle may include un-shielded wires or groups of wires. Specifically, the wire bundle 110 includes sixteen wires 116 arranged in eight differential pairs having a helical shape. The wire bundle 110 has six differential pairs extending around the perimeter of the cable 106, and two differential pairs extending in the center of the cable 106. Alternatively, the wires 116 could be formed in a different shape, such as, for example, a linear shape.

The first electrical connector 102 includes a housing 120 arranged in an upright orientation with an upper shell 122 and a lower shell 124 that extends between an interconnect end 126 and a rear end 128. The first electrical connector 102 also includes an interconnect cavity 130 located adjacent the interconnect end 126. The interconnect cavity 130 has a non-uniform envelope that functions as a keying feature to orient the first electrical connector 102 in an upright position with respect to the receptacle. The non-uniform envelope has a trapezoidal shape with a long edge 129 located proximate to the upper shell 122 and extending parallel to a short edge 131 located proximate to the lower shell 124. A circuit board 132 is operatively positioned in an upright orientation within the interconnect cavity 130, such that the circuit board 132 can be electrically and mechanically coupled to a receptacle (not shown), or mating connector. The first end 112 of the cable 106 is coupled to the rear end 128 of the first electrical connector 102. Moreover, the wires 116 extend through the rear end 128 and into the interior portion of the first electrical connector 102 and are electrically coupled to the circuit board 132, as will be described in detail below.

The second electrical connector 104 includes a housing 134 arranged in an upright orientation with an upper shell 136 and a lower shell 138 that extends between an interconnect end 140 and a rear end 142. The second electrical connector 104 also includes an interconnect cavity 144 located adjacent the interconnect end 130. The interconnect cavity 144 has a non-uniform envelope that functions as a keying feature to orient the second electrical connector 104 in an upright position with respect to the receptacle. The non-uniform envelope has a trapezoidal shape with a long edge 143 located proximate to the upper shell 136 and extending parallel to a short edge 145 located proximate to the lower shell 138. A circuit board 146 is operatively positioned in an upright orientation within the interconnect cavity 144, such that the circuit board 146 can be electrically and mechanically coupled to a receptacle (not shown), or mating connector. The second end 114 of the cable 106 is coupled to the rear end 142 of the second electrical connector 104. Moreover, the wires 116 extend through the rear end 142 and into the interior portion of the second electrical connector 104 and are electrically coupled to the circuit board 146, as will be described in detail below. The second circuit board 146 has a different trace arrangement than the first circuit board 132 to facilitate easier routing of the wires 116 between the first and second circuit boards 132 and 146.

Figure 2:
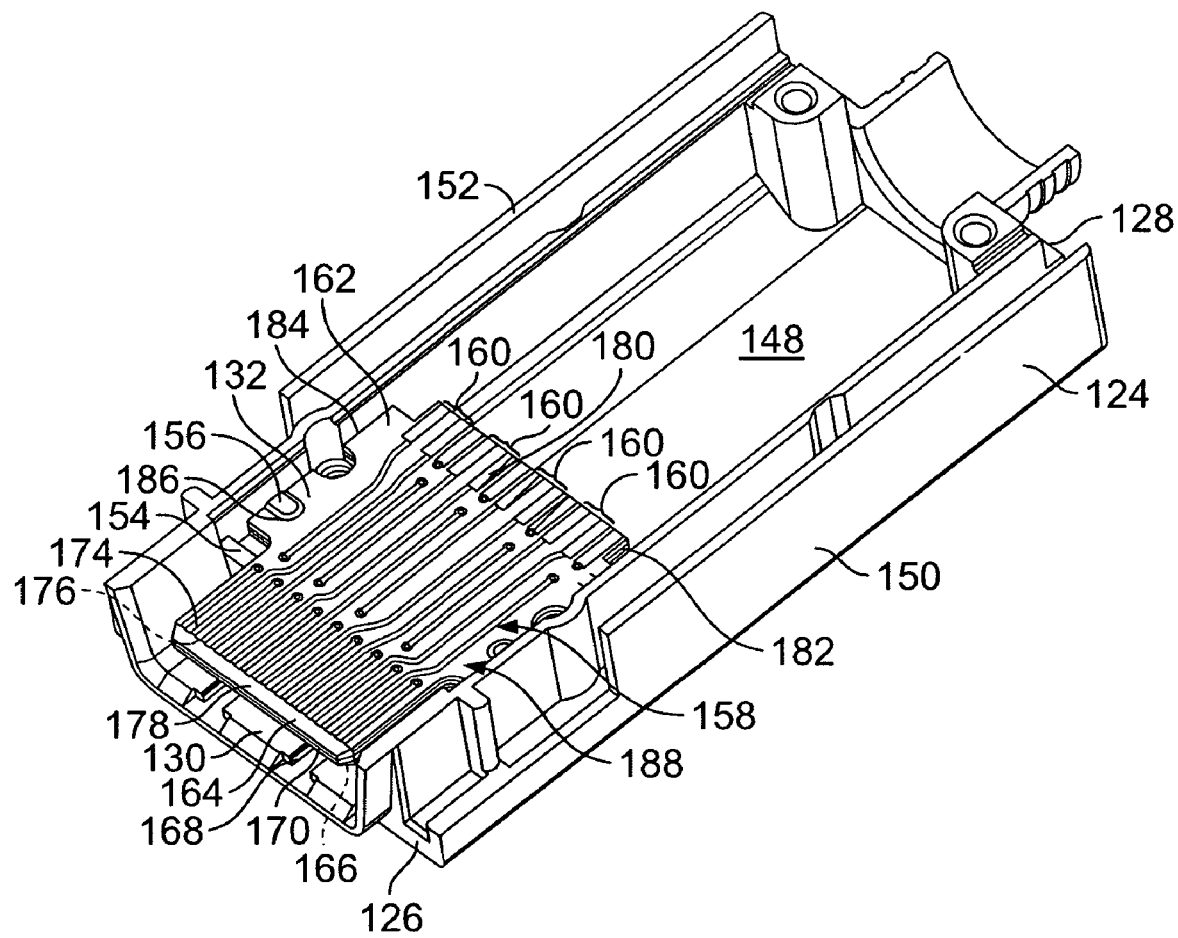
FIG. 2 illustrates a top perspective view of a portion of the cable assembly shown in FIG. 1.

FIG. 2 is a perspective view of a portion of the first electrical connector 102 including the lower shell 124 and the circuit board 132. While the electrical connector shown in FIG. 2 is described and illustrated in the context of the first electrical connector 102, it is recognized that the upper and lower shells 122, 124, 136 and 138 of the first and second electrical connectors 102 and 104 are similar, but receive circuit boards 132 and 146 that have different wire management configurations. As such, like reference numerals will be used to describe like components. The lower shell 124 includes a cavity 148 between the interconnect end 126 and the rear end 128, and between side walls 150 and 152 extending the length of the housing 120. The lower shell 124 includes a shelf 154 extending between the side walls 150 and 152 proximate to the interconnect end 126 of the housing 120. The lower shell 124 also includes keying features 156 extending inwardly from the side walls 150 and 152. The shelf 154 and the keying features 156 facilitate aligning the circuit board 132 within the housing 120.

The circuit board 132 includes circuit components, shown generally at 158, that perform signal conditioning upon high speed serial data received from the wires 116. As shown in FIG. 2, the circuit components 158 may be arranged as differential pairs, shown generally at 160. However, as will be described in detail below, the first circuit board 132 and the second circuit board 146 have different circuit component arrangements to facilitate reducing assembly time of the cable assembly 100. As shown in FIG. 2, the circuit board 132 includes a body 162 having a top signal layer 164, a bottom signal layer 166, a top ground layer 168, and a bottom ground layer 170, wherein the ground layers each include a horizontal ground plane (not shown). The body 162 also includes a top surface 174, a bottom surface 176, a separable interface end 178, a wire management end 180. The circuit board 132 has an upright orientation such that the circuit board 132 is located within the housing 120 with the top surface 174 facing the long edge 129 of the interconnect cavity 130 and the bottom surface 176 facing the short edge 131 of the interconnect cavity. Moreover, the separable interface end 178 is located proximate to the interconnect end 126 of the housing 120.

Side edges 182 and 184 extend between the separable interface end 178 and the wire management end 180. The side edges 182 and 184 include notched out portions 186 that correspond to the keying features 156. The circuit board 132 is oriented within the cavity 148 such that a portion of the circuit board 132 is contained within the interconnect cavity 130. Specifically, the circuit board 132 is placed on the shelf 154 and the notched out portions 186 of the circuit board 132 conform to the keying features 156 of the lower shell 124. As such, the separable interface end 178 is positioned within the interconnect cavity 130 and is oriented to interface with the electrical components of the mating connector (not shown) when the electrical connector 100 and the mating connector are mated.

Figure 4:
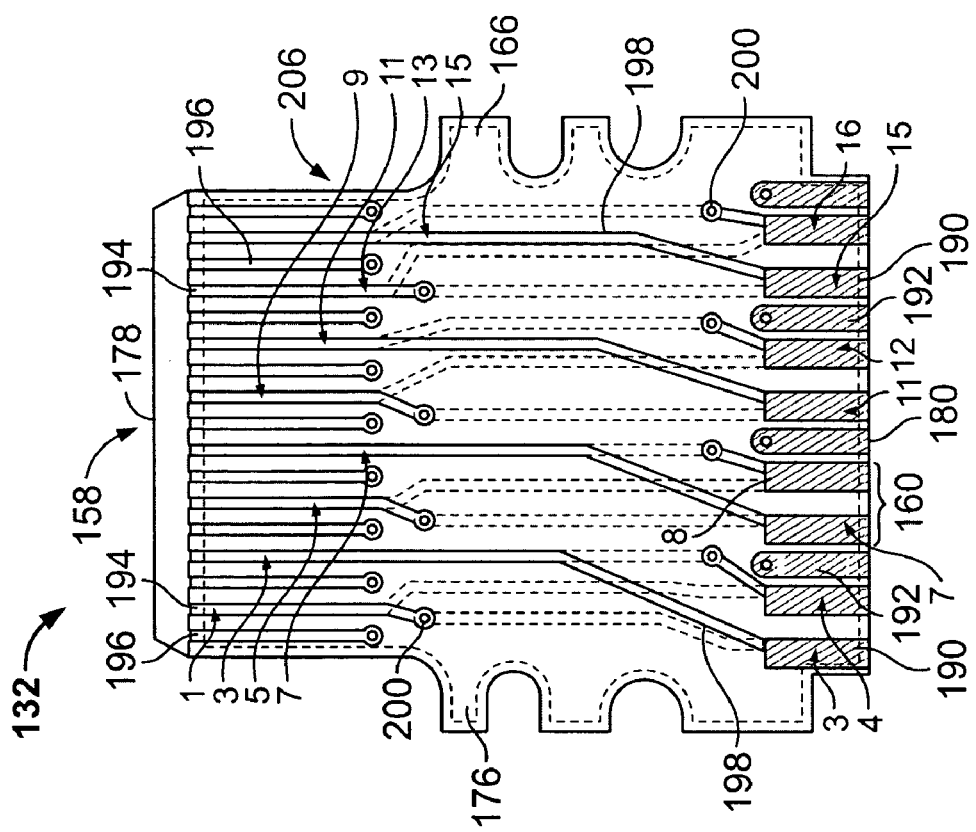
FIG. 4 illustrates a bottom view of the circuit board shown in FIG. 3.
Figure 3:
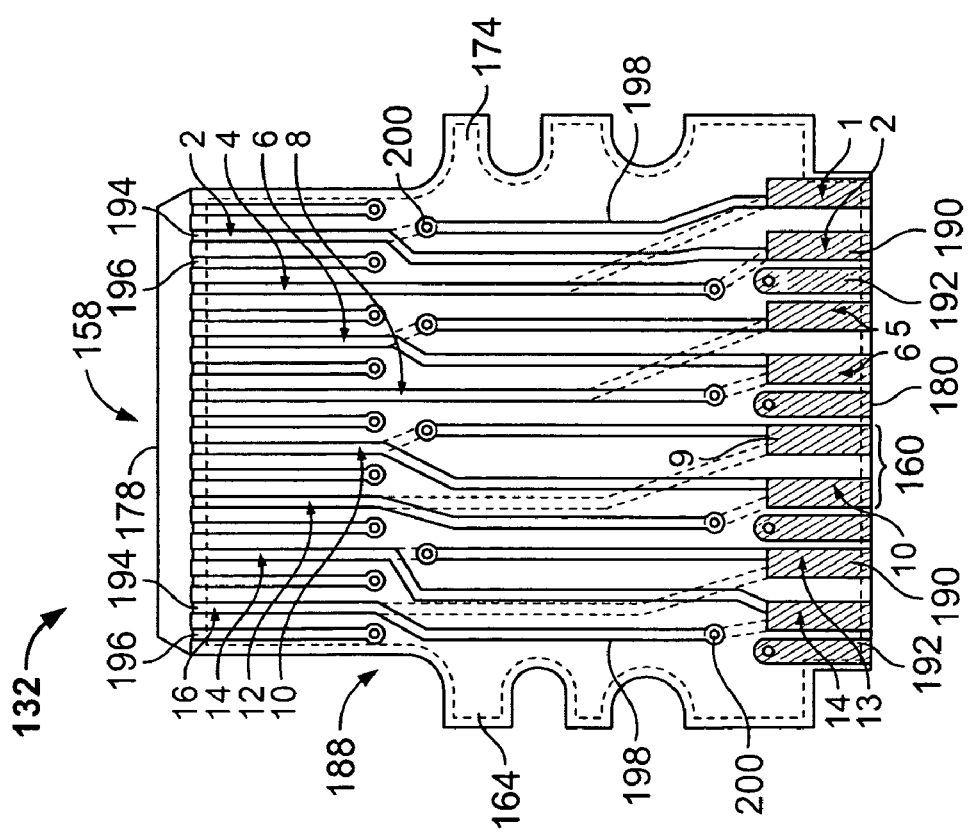
FIG. 3 illustrates a top view of a circuit board used in the cable assembly shown in FIG. 1.

FIG. 3 illustrates a top view of the first circuit board 132. FIG. 4 illustrates a bottom view of the first circuit board 132. As illustrated in FIGS. 3 and 4, the first circuit board 132 has a first wire management configuration 188 such that the circuit components 158 are oriented on the first circuit board 132 in a particular pattern. Specifically, the circuit components 158 are electrically and mechanically coupled to the top signal layer 164 on the top surface 174 as shown in FIG. 3. Additionally, the circuit components 158 are electrically and mechanically coupled to the bottom signal layer 166 on the bottom surface 176 as shown in FIG. 4. Alternatively, the circuit components 158 may have other wire management configurations.

The circuit components 158 include a plurality of signal contacts 190, a plurality of ground contacts 192, a plurality of interface signal contacts 194, and a plurality of interface ground contacts 196. The circuit components 158 are connected to one another by traces 198 extending between the signal contacts 190 and the interface signal contacts 194, and by a plurality of vias 200 that extend through the circuit board 132 between the top signal layer 164 and the bottom signal layer 166.

The signal contacts 190 and the ground contacts 192 are arranged at the wire management end 180 of the first circuit board 132 such that the wires 116 delivered to the first electrical connector 102 can be coupled directly to the signal contacts 190. Moreover, the signal contacts 190 are arranged as a differential pair 160 such that two individual signal contacts 190 are placed adjacent one another on a common side of the first circuit board 132. The adjacent signal contacts 190 are interconnected along a pair of traces 198 to a pair of interface signal contacts 194. In one embodiment, the interface signal contacts 194 are positioned on opposite sides of the first circuit board 132, such that one of the interface signal contacts 194 is located on the top signal layer 164 and the other interface signal contact 194 is located on the bottom signal layer 166. Furthermore, the pair of traces 198 that initially extend from the adjacent signal contacts 190 are partially positioned on opposite sides of the first circuit board 132 such that one of the interface signal contacts 194 is located on the top signal layer 164 and the other interface signal contact 194 is located on the bottom signal layer 166 proximate to the separable interface end 178 of the first circuit board 132. The traces 198 are transferred or routed to the opposing layer 164 or 166 by the vias 200. Optionally, the traces 198 may extend along the opposing layers 164 or 166 along a plane that is generally perpendicular to the circuit board plane (not shown).

Each differential pair 160 is separated from each other differential pair 160 by a ground contact 192. This arrangement reduces cross talk between the differential pairs 160. Optionally, the signals transmitted through the first circuit board 132 may have a single ended arrangement such that each trace 198 carries an independent signal and can function without the need of any other signal having an opposite voltage to balance the electromagnetic fields created by the individual signals. The top and bottom ground layers 168 and 170 provide the single ended coupling of each signal due to the close coupling of the trace 198 to the respective ground layer 168 and 170. Specifically, the electromagnetic fields of each signal are constrained between the trace 198 and the respective ground layer 168 and 170. As such, traces 198 can be located in close proximity to other traces 198 and not be located within the primary fields of one another. Therefore coupling and cross talk is limited between the fields. However, two single ended signals may be coupled differentially by sending equal but opposite signals on two separate traces 198. Furthermore, due to the single ended nature of the signals, the separate signals of the differential pair 160 can be transmitted from any location on the first circuit board 132.

Figure 6:
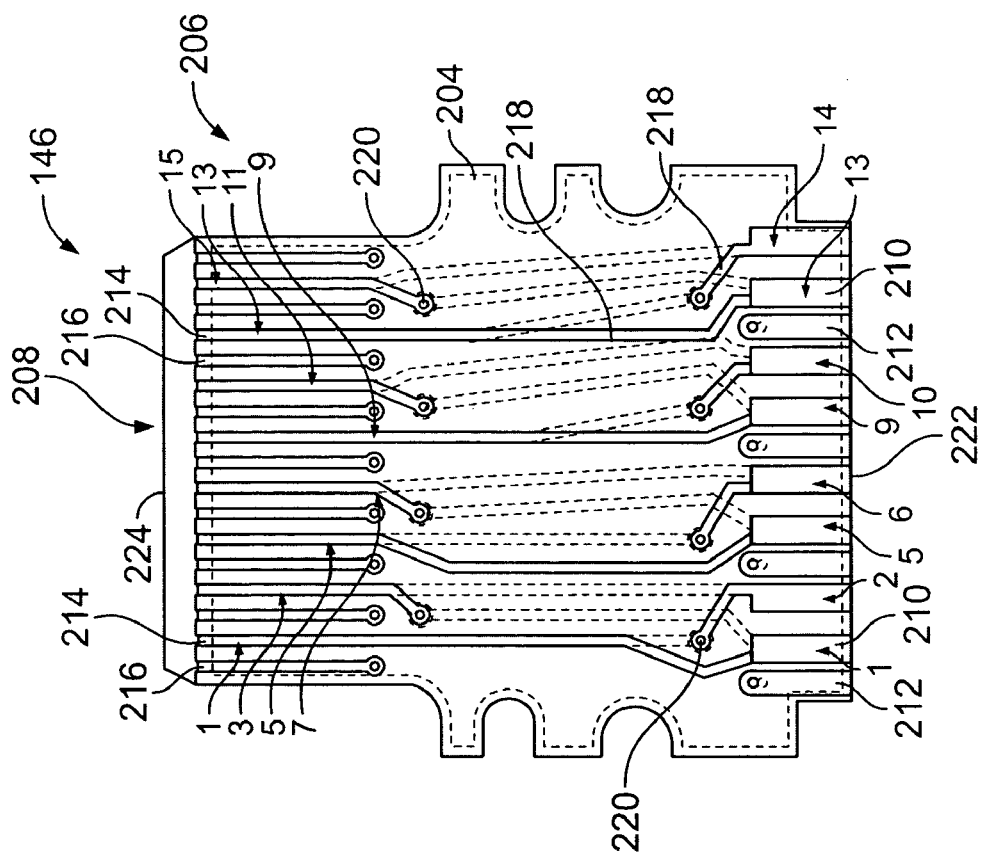
FIG. 6 illustrates a bottom view of the circuit board shown in FIG. 5.
Figure 5:
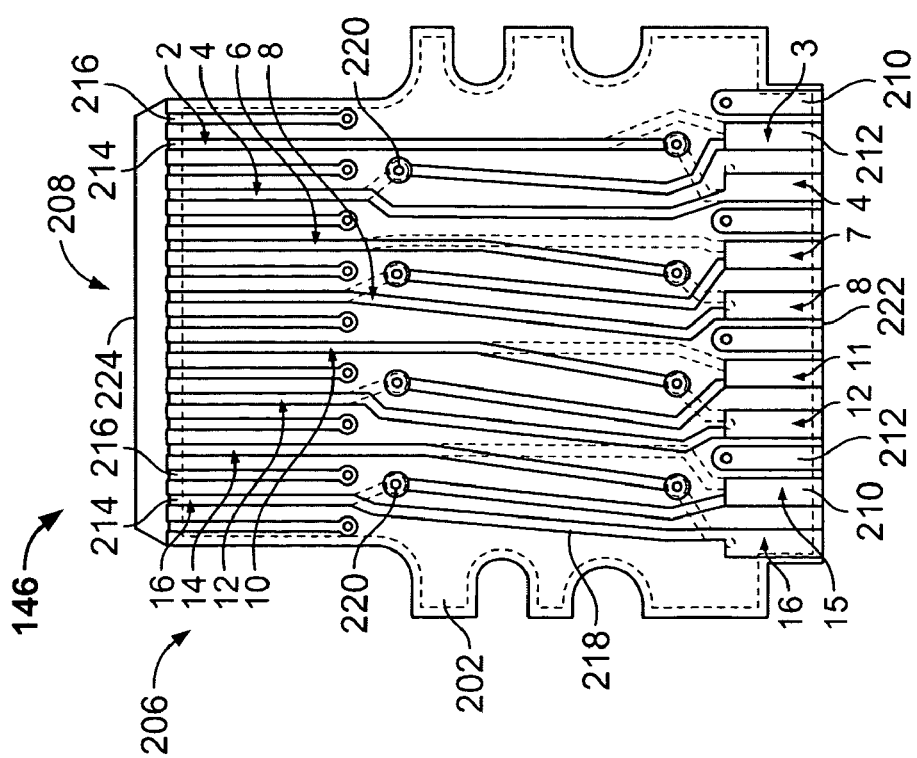
FIG. 5 illustrates a top view of another circuit board used in the cable assembly shown in FIG. 1.

FIG. 5 illustrates a top view of the second circuit board 146 including a top signal layer 202. FIG. 6 illustrates a bottom view of the second circuit board 146 including a bottom signal layer 204. As illustrated in FIGS. 5 and 6, the second circuit board 146 has a second wire management configuration 206 such that circuit components 208 are oriented on the second circuit board 146 in a particular pattern. Specifically, the circuit components 208 are electrically and mechanically coupled to the top signal layer 202 as shown in FIG. 5. Additionally, the circuit components 208 are electrically and mechanically coupled to the bottom signal layer 204 as shown in FIG. 4. Alternatively, the circuit components 208 may have other wire management configurations.

The circuit components 208 include a plurality of signal contacts 210 and a plurality of ground contacts 212 positioned on a wire management end 222 of the second circuit board 146, and a plurality of interface signal contacts 214 and a plurality of interface ground contact 216 positioned on a separable interface end 224 of the second circuit board 146. The circuit components 208 are connected to one another by traces 218 extending between the signal contacts 210 and the interface signal contacts 214, and by a plurality of vias 220 that extend through the circuit board 146 between the top signal layer 202 and the bottom signal layer 204.

The signal contacts 210 and the ground contacts 212 are arranged at the wire management end 222 of the second circuit board 146 such that the wires 116 delivered to the second electrical connector 104 can be coupled directly to the signal contacts 210. Moreover, the signal contacts 210 are arranged differentially such that two individual signal contacts 210 are placed adjacent one another on a common side of the second circuit board 146. The adjacent signal contacts 210 are interconnected along a pair of traces 218 to a pair of interface signal contacts 214. In one embodiment, the interface signal contacts 214 are positioned on opposite sides of the second circuit board 146, such that one of the interface signal contacts 214 is located on the top signal layer 202 and the other interface signal contact 214 is located on the bottom signal layer 204. Furthermore, the pair of traces 218 that initially extend from the adjacent signal contacts 210 are partially positioned on opposite sides of the second circuit board 146 such that one of the interface signal contacts 214 is located on the top signal layer 202 and the other interface signal contact 214 is located on the bottom signal layer 204 proximate to the separable interface end 224 of the second circuit board 146. The traces 218 are transferred or routed to the opposing layer 202 or 204 by the vias 220. Optionally, the traces 218 may extend along the opposing layers 202 or 204 along a plane that is generally perpendicular to the circuit board plane (not shown).

Each differential pair 160 is separated from each other differential pair 160 by a ground contact 212. This arrangement reduces cross talk between the differential pairs 160. Optionally, the signals transmitted through the second circuit board 146 may have a single ended arrangement such that each trace 198 carries an independent signal and can function without the need of any other signal having an opposite voltage to balance the electromagnetic fields created by the individual signals.

Figure 7:
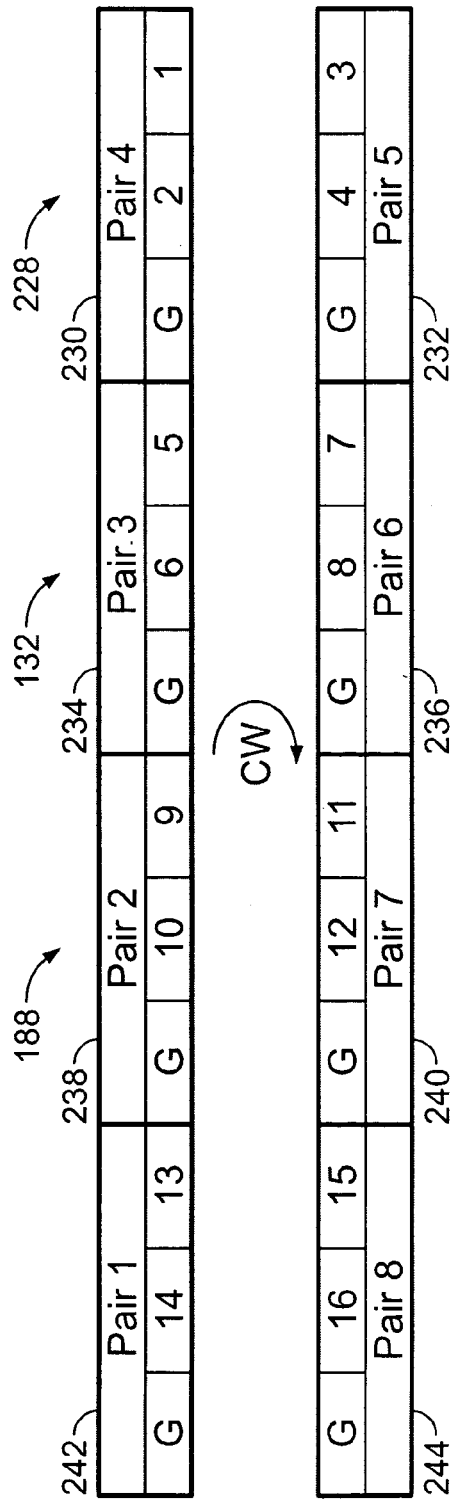
FIG. 7 illustrates a schematic illustration of a wire management configuration for the circuit board shown in FIG. 3.
Figure 8:
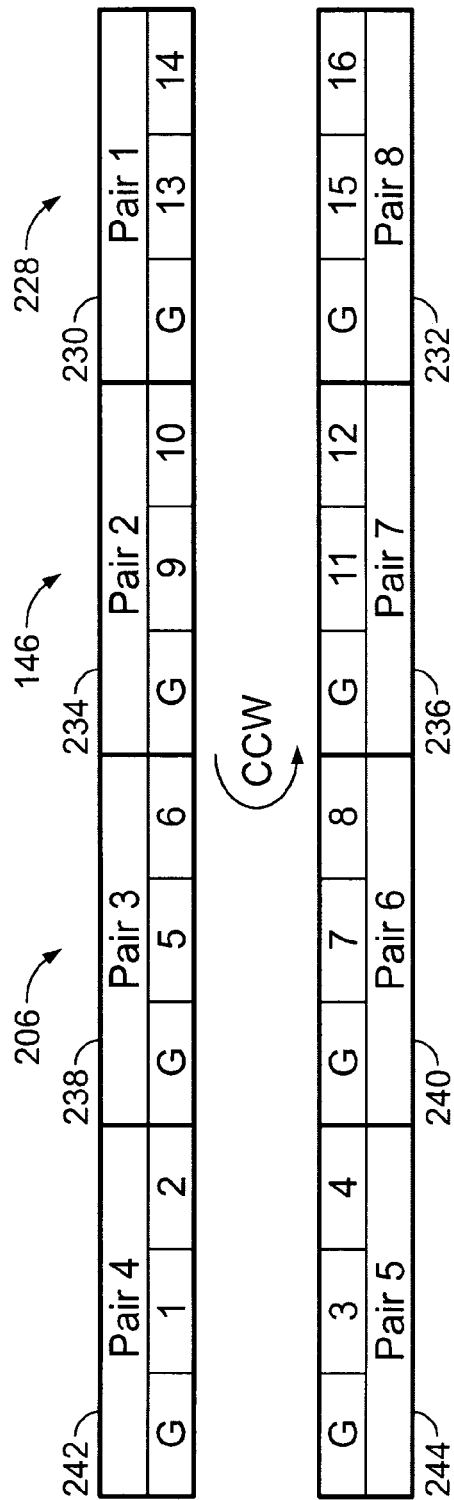
FIG. 8 illustrates a schematic illustration of a wire management configuration for the circuit board shown in FIG. 5.

FIG. 7 is a schematic illustration of the first wire management configuration 188 showing the wire management end 180 of the first circuit board 132 including the connection of each of the wires 116 and the arrangement of the differential pairs 160. FIG. 8 is a schematic illustration of the second wire management configuration 206 showing the wire management end 222 of the second circuit board 146 including the connection of each of the wires 116 and the arrangement of the differential pairs 160.

As illustrated in FIGS. 7 and 8, the cable assembly 100 includes sixteen wires 116 and eight differential pairs 160. The first circuit board 132 has the first wire management configuration 188 and the second circuit board 146 has the second wire management configuration 206. Specifically, the first wire management configuration 188 and the second wire management configuration 206 are inverse configurations of one another such that the wires 116 extending from the first circuit board 132 readily align with the associated signal contacts 210 and the associated ground contacts 212 of the second circuit board 146. Moreover, as indicated above, each of the circuit boards 132 and 146 have an upright orientation within the respective housings 120 and 134 (FIG. 1). Accordingly, the cable assembly 100 facilitates reducing the need to manipulate and rearrange the wires 116 at the opposite end of the cable 106.

Each of the wires 116 are numbered consecutively from one to sixteen. The wires 116 are coupled to the first and second circuit boards 132 and 146 and arranged as a differential pair 160. Each differential pair 160 has a ground contact G, such as ground contact 192 (FIGS. 3 and 4) or ground contact 212 (FIGS. 5 and 6), associated therewith. Accordingly, each of the first and second circuit boards 132 and 146 have eight contact layout positions 228. Specifically, each of the first and second circuit boards 132 and 146 includes a right upper outer position 230, a right lower outer position 232, a right upper inner position 234, a right lower outer position 236, a left upper inner position 238, a left lower inner position 240, a left upper outer position 242, and a left lower outer position 244 when viewing the wire management end 180 or 222 of the circuit boards 132 and 146. The sixteen wires 116 are coupled to the first and second circuit boards 132 and 146 in differential pairs 160 in one of the eight contact layout positions 228.

In the exemplary embodiment, the first wire management configuration 188 and the second wire management configuration 206 are inverse configurations of one another such that the differential pairs 160 associated with the first circuit board 132 are transposed with respect to the differential pairs 160 associated with the second circuit board 146. Specifically, the differential pair 160 coupled to the right upper outer position 230 on the first circuit board 132 is coupled to the left upper outer position 242 on the second circuit board 146 and vice versa. Similarly, the differential pair 160 coupled to the right upper inner position 234 on the first circuit board 132 is coupled to the left upper inner position 238 on the second circuit board 146 and vice versa. Moreover, the differential pair 160 coupled to the right lower outer position 232 on the first circuit board 132 is coupled to the left lower outer position 244 on the second circuit board 146 and vice versa. Similarly, the differential pair 160 coupled to the right lower inner position 236 on the first circuit board 132 is coupled to the left lower inner position 240 on the second circuit board 146 and vice versa. Moreover, the wires associated with each differential pair 160 are inverted on the opposing circuit board 132 or 146. As such, the differential pairs of wires 116 are joined to the first circuit board 132 in a clockwise pattern (CW) about the first circuit board 132, while the differential pairs of wires 116 are joined to the second circuit board 146 in a counter-clockwise pattern (CCW) about the second circuit board 146. Accordingly, the wires 116 are properly aligned between the respective circuit boards 132 and 146.

The above-described embodiments provide a cost effective and reliable means for developing a cable assembly 100. Specifically, the cable assembly 100 includes a cable 106 extending between two opposing electrical connectors 102 and 104. The cable 106 houses a wire bundle 110 having a plurality of wires 116 that may be arranged as a differential pair 160. The wires 116 are electrically and mechanically coupled to circuit boards 132 and 146 in the respective electrical connectors 102 and 104, and the circuit boards 132 and 146 each have different trace arrangements. Accordingly, the wires 116 in the wire bundle 110 extending from the signal contacts 190 of the first circuit board 132 are aligned in a natural and direct manner with the corresponding signal contacts 210 of the second circuit board 146. As a result, the assembly time and complexity, and thereby the overall cost of the cable assembly 100, are reduced, while the mechanical reliability is improved.

Exemplary embodiments of a cable assembly 100 are described above in detail. The cable assembly 100 is not limited to the specific embodiments described herein, but rather, components of each cable assembly 100 may be utilized independently and separately from other components described herein. For example, each cable assembly 100 component can also be used in combination with other cable assembly 100 components.

While the invention has been described in terms of various specific embodiments, those skilled in the art will recognize that the invention can be practiced with modification within the spirit and scope of the claims.

What is claimed is:

1. A cable assembly, comprising:
   a wire bundle having at least first and second pairs of wires arranged in first and second differential pairs;
   first and second connectors provided on first and second ends of said wire bundle, said first and second connectors including first and second circuit boards, respectively, each of said first and second circuit boards having a wire management end and a separable interface end; and
   contacts provided, at said wire management end, on each of said first and second circuit boards, said contacts being arranged in a contact layout that is apportioned into upper inner, upper outer, lower inner, and lower outer positions at said wire management end,
   said first pair of wires having a first end that is terminated, to a pair of said contacts located in said upper inner position at said wire management end of said first circuit board, said first pair of wires having an opposed second end that is terminated to a pair of said contacts located in said upper outer position at said wire management end of said second circuit board such that said first and second ends of said first and second pairs of wires are terminated on said first and second circuit boards in accordance with different first and second wire management configurations, respectively.

2. The cable assembly of claim 1, wherein said wires are shielded wires within said wire bundle.

3. The cable assembly of claim 1, wherein said first and second wire management configurations are inverses of one another.

4. The cable assembly of claim 1, further comprising 1 to N pairs of wires, said 1 to N pairs of wires being joined to said first circuit board in a clockwise pattern about said upper inner, upper outer, lower inner, and lower outer positions on said first circuit board, said 1 to N pairs of wires being joined to said second circuit board in a counter-clockwise pattern about said upper inner, upper outer, lower inner, and lower outer positions on said second circuit board.

5. The cable assembly of claim 1, wherein said contacts on said first and second circuit boards are located immediately adjacent said wire management ends and said separable interfaces ends.

6. The cable assembly of claim 1, wherein said pair of contacts on said first circuit board are located on a common side and at said wire management end of said first circuit board, said pair of contacts being interconnected along a pair of traces to a pair of interface signal contacts at said separable interface end of said first circuit board, said pair of interface signal contacts being located opposite one another on opposite sides of said first circuit board.

7. The cable assembly of claim 1, wherein said a pair of contacts on said first circuit board are located on a common side and at said wire management end of said first circuit board, said pair of contacts being interconnected along a pair of traces to a pair of interface signal contacts at said separable interface end of said first circuit board, said pair of traces being located on opposite sides of said first circuit board.

8. The cable assembly of claim 1, further comprising signal traces on said first circuit board arranged in differential pairs, wherein signal traces of a first differential pair are located on opposite sides of said first circuit board and arranged along a plane extending perpendicularly to said sides of said first circuit board.

9. The cable assembly of claim 1, wherein said upper inner and upper outer positions are located on one side of said first circuit board and said lower inner and lower outer positions are located on an opposite side of said first circuit board.

10. A cable assembly, comprising:
    a wire bundle having at least first and second pairs of wires arranged in first and second differential pairs;

first and second connectors provided on first and second ends of said wire bundle, said first and second connectors including first and second circuit boards, respectively, each of said first and second circuit boards having a wire management end and a separable interface end; and contacts provided, at said wire management end, on each of said first and second circuit boards, said contacts being arranged in a contact layout that is apportioned into upper inner, upper outer, lower inner, and lower outer positions at said wire management end, said first pair of wires having a first end that is terminated to a pair of said contacts located in one of said upper inner, upper outer, lower inner, and lower outer positions at said wire management end of said first circuit board, said first pair of wires having an opposed second end that is terminated to a pair of said contacts located in a different one of said upper inner, upper outer, lower inner, and lower outer positions at said wire management end of said second circuit board, wherein said first ends of said first and second pairs of wires are terminated on said first circuit board in a clockwise first wire management configuration, and said second ends of said first and second pairs of wires are terminated on said first and second circuit boards in a counterclockwise second wire management configuration.

11. The cable assembly of claim 10, wherein said wires are shielded wires within said wire bundle.

12. The cable assembly of claim 10, wherein said first and second wire management configurations are inverses of one another.

13. The cable assembly of claim 10, further comprising 1 to N pairs of wires, said 1 to N wires being joined to said first circuit board in a clockwise pattern about said upper inner, upper outer, lower inner, and lower outer positions at said first circuit board, said 1 to N wires being joined to said second circuit board in a counter-clockwise pattern about said upper inner, upper outer, lower inner, and lower outer positions at said second circuit board.

14. The cable assembly of claim 10, wherein said pair of contacts are provided on a common side at said wire management end of said first circuit board, said pair of contacts being interconnected along a pair of traces to a pair of interface signal contacts at said separable interface end of said first circuit board, said pair of interface signal contacts being located opposite one another on opposite sides of said first circuit board.

15. The cable assembly of claim 10, wherein said pair of contacts is provided on a common side at said wire management end of said first circuit board, said pair of contacts being interconnected along a pair of traces to a pair of interface signal contacts at said separable interface end of said first circuit board, said pair of traces being located on opposite sides of said first circuit board.

16. The cable assembly of claim 10, further comprising signal traces on said first circuit board, wherein said signal traces are located on opposite sides of said first circuit board and arranged along a plane extending perpendicularly to said sides of said first circuit board.

17. The cable assembly of claim 10, wherein said upper inner and upper outer positions are located on one side of said first circuit board and said lower inner and lower outer positions are located on an opposite side of said first circuit board.

* * * * *